United States Patent
Kasahara et al.

(10) Patent No.: US 9,825,418 B2
(45) Date of Patent: Nov. 21, 2017

(54) LASER-OSCILLATION COOLING DEVICE (71) Applicant: MITSUBISHI HEAVY INDUSTRIES, LTD., Tokyo (JP)

(72) Inventors: Jiro Kasahara, Tokyo (JP); Yoshiyuki Kondo, Tokyo (JP); Shinya Ishii, Tokyo (JP); Koichi Hamamoto, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 92 days.

(21) Appl. No.: 15/103,113

(22) PCT Filed: Feb. 26, 2015

(86) PCT No.: PCT/JP2015/055612
§ 371 (c)(1),
(2) Date: Jun. 9, 2016

(87) PCT Pub. No.: WO2015/141430
PCT Pub. Date: Sep. 24, 2015

(65) Prior Publication Data
US 2016/0308326 A1  Oct. 20, 2016

(30) Foreign Application Priority Data
Mar. 20, 2014 (JP) ................ 2014-058886

(51) Int. Cl.
*H01S 3/04* (2006.01)
*H01S 5/024* (2006.01)
(Continued)

(52) U.S. Cl.
CPC .......... *H01S 3/0407* (2013.01); *H01L 23/427* (2013.01); *H01S 3/04* (2013.01);
(Continued)

(58) Field of Classification Search
CPC .......... H01S 3/0407; H01S 3/042; H01S 3/04; H01S 5/02423; H01S 5/024
See application file for complete search history.

(56) References Cited

U.S. PATENT DOCUMENTS 5,349,596 A * 9/1994 Molva .................... B82Y 20/00
257/12
5,982,792 A * 11/1999 Kasamatsu ............. H01S 3/042
372/34
(Continued)

FOREIGN PATENT DOCUMENTS

DE    44 37 489    3/1996
JP    61-501588    7/1986
(Continued)

OTHER PUBLICATIONS

International Search Report issued May 19, 2015 in corresponding International Application No. PCT/JP2015/055612.
(Continued)

*Primary Examiner* — Kinam Park
(74) *Attorney, Agent, or Firm* — Wenderoth, Lind & Ponack, L.L.P.

(57) ABSTRACT

A laser-oscillation cooling device includes a laser excitation unit that excites a laser beam and locally emits heat, a storage tank that is capable of storing a cryogenic liquid at an atmospheric pressure and discharge the cryogenic liquid which is evaporated, a pressurization and supply unit that pressurizes the cryogenic liquid stored in the storage tank and supplies the pressurized cryogenic liquid to the laser excitation unit, and a decompression and return unit that decompresses the cryogenic liquid which is supplied to the laser excitation unit and used to cool the laser excitation unit and returns the cryogenic liquid to the storage tank.

4 Claims, 4 Drawing Sheets

(51) Int. Cl.
*H01S 3/042* (2006.01)
*H01L 23/427* (2006.01)

(52) U.S. Cl.
CPC .............. *H01S 3/042* (2013.01); *H01S 5/024* (2013.01); *H01S 5/02423* (2013.01); *H01L 2924/0002* (2013.01)

(56) References Cited

U.S. PATENT DOCUMENTS

| | | | | |
|---|---|---|---|---|
| 6,195,372 | B1* | 2/2001 | Brown | H01S 3/042 372/34 |
| 9,209,598 | B1* | 12/2015 | Reagan | H01S 5/024 |
| 2012/0113513 | A1* | 5/2012 | Zhang | H01S 3/027 359/513 |
| 2013/0286480 | A1* | 10/2013 | Hirota | G02B 5/3083 359/492.01 |
| 2015/0010030 | A1* | 1/2015 | Hirota | H01S 3/16 372/35 |

FOREIGN PATENT DOCUMENTS

| | | |
|---|---|---|
| JP | 6-68725 | 9/1994 |
| JP | 9-14830 | 1/1997 |
| JP | 2002-246522 | 8/2002 |
| JP | 2003-309310 | 10/2003 |
| JP | 2006-237170 | 9/2006 |
| JP | 2008-27780 | 2/2008 |
| JP | 2013-520010 | 5/2013 |
| JP | 2013-228574 | 11/2013 |
| JP | 2013-229574 | 11/2013 |

OTHER PUBLICATIONS

Written Opinion of the International Searching Authority issued May 19, 2015 in corresponding International Application No. PCT/JP2015/055612.
Extended European Search Report dated Jan. 5, 2017 in corresponding European Application No. 15765048.2.
Notification of Reasons for Refusal dated Apr. 11, 2017 in corresponding Japanese Application No. 2014-058886 (with machine translation).

* cited by examiner

LASER-OSCILLATION COOLING DEVICE

TECHNICAL FIELD

The present invention relates to a laser-oscillation cooling device.

Priority is claimed on Japanese Patent Application No. 2014-058886, filed Mar. 20, 2014, the content of which is incorporated herein by reference.

BACKGROUND ART

An output of a solid-state laser such as a semiconductor laser is amplified and is used, for example, as a light source in a laser processing machine. It is known that, in an oscillation medium that oscillates a solid-state laser, an amount of heat emitted increases with an increase in the output thereof. Such an oscillation medium is a heat-emitting body, and a possibility exists that the oscillation medium may affect an operation of a device by diffusing heat to the surrounding thereof. Accordingly, it is necessary to cool the heat-emitting body.

As a technique of cooling the heat-emitting body, for example, techniques described in Patent Literature 1 and Patent Literature 2 are known.

Patent Literature 1 discloses a cooling device for a solid-state laser. The cooling device described in Patent Literature 1 includes a heat sink that is bonded to a solid-state laser oscillation element, a coolant tank that supplies a coolant, and a supply pipe that cause the coolant to circulate in the heat sink.

Patent Literature 2 discloses a cooling device for a magnetic resonance imaging (MRI) device. In the MRI device, a configuration in which liquid nitrogen, which is supplied as a cooling medium to a cryostat and made to circulate via a refrigerator, is employed to cool a gradient magnetic-field coil as a heat-emitting body. The liquid nitrogen is provided to cool the gradient magnetic-field coil in contact with the cryostat, has its temperature lowered by passing through a refrigerator, and flows through the cryostat again.

When the heat-emitting body is a laser medium in a laser oscillation device as described above, the amount of heat emitted reaches, for example, 0.25 KW per square centimeter. Accordingly, it is effective to spray the cooling medium directly onto the heat-emitting body so as to achieve a satisfactory cooling effect.

It is known that the cooling medium that is provided to cool the heat-emitting body and is evaporated is about 1% of the total cooling medium. That is, most of the cooling medium is not provided for cooling but is discharged. Accordingly, it is not economical to supply the cooling medium continuously and it is desirable to recover and reuse the cooling medium.

CITATION LIST

Patent Literature

[Patent Literature 1]
Japanese Unexamined Utility Model Application, First Publication No. Hei 6-68725
[Patent Literature 2]
Japanese Unexamined Patent Application, First Publication No. 2002-246522

SUMMARY OF INVENTION

Technical Problem

However, in the techniques described in Patent Literature 1 and Patent Literature 2, a cooling medium supply path is constituted as a circulation system isolated from the outside. Accordingly, when the cooling medium sprayed to the outside from the supply path is recovered, a possibility of the cooling medium not being satisfactorily recovered exists in the technique described in Patent Literature 1 or the Patent Literature 2.

The present invention is made in consideration of the above-mentioned circumstances and an object thereof is to provide a laser oscillation cooling device that has a satisfactory cooling effect and can appropriately recover a cooling medium.

Solution to Problem

In order to achieve the above-mentioned object, the present invention employs the following constitutions.

According to a first aspect of the present invention, there is provided a laser-oscillation cooling device including: a laser excitation unit that excites a laser beam and locally emits heat; a storage tank that is capable of storing a cryogenic liquid at an atmospheric pressure and discharge the cryogenic liquid which is evaporated; a pressurization and supply unit that pressurizes the cryogenic liquid stored in the storage tank and supplies the pressurized cryogenic liquid to the laser excitation unit; and a decompression and return unit that decompresses the cryogenic liquid which is supplied to the laser excitation unit and used to cool the laser excitation unit and returns the cryogenic liquid to the storage tank.

In this laser-oscillation cooling device, since the cryogenic liquid is recovered and decompressed by the decompression and return unit, the temperature of the cryogenic liquid increased by cooling the laser excitation unit decreases.

The cryogenic liquid reduced in temperature can be stored to the storage tank again and can be used to cool the laser excitation unit again.

A second aspect of the present invention provides the laser-oscillation cooling device according to the first aspect, wherein the decompression and return unit may include a decompression valve that decompresses the cryogenic liquid.

According to this constitution, since the cryogenic liquid flows in the decompression valve, it is possible to satisfactorily decompress the cryogenic liquid and to simply constitute the decompression and return unit.

A third aspect of the present invention provides the laser-oscillation cooling device according to any one of the above-mentioned aspects, wherein the laser excitation unit may be disposed in a cryostat of which the inside is kept at a low temperature.

According to this constitution, since the temperature of the cryogenic liquid can be kept at a low temperature by disposing the laser excitation unit as a heat-emitting body in the cryostat, it is possible to effectively cool the laser excitation unit.

A fourth aspect of the present invention provides the laser-oscillation cooling device according to any one of the above-mentioned aspects, wherein the pressurization and supply unit may include a spray nozzle that sprays the cryogenic liquid toward the laser excitation unit.

According to this constitution, since the cryogenic liquid can be supplied to the laser excitation unit at a higher flow speed by spraying the cryogenic liquid from the spray nozzle, it is possible to more effectively cool the laser excitation unit.

A fifth aspect of the present invention provides the laser-oscillation cooling device according to any one of the above-mentioned aspects, wherein the pressurization and supply unit may include a micro-channel that is disposed to come in contact with the laser excitation unit and causes the pressurized cryogenic liquid to flow therein.

According to this constitution, since a contact area of the cryogenic liquid with the laser excitation unit increases by disposing the micro-channel in the pressurization and supply unit, it is possible to more effectively cool the laser excitation unit.

Advantageous Effects of Invention

According to the laser-oscillation cooling device of the present invention, it is possible to achieve a satisfactory cooling effect and to appropriately recover and reuse the cooling medium.

DESCRIPTION OF EMBODIMENTS

[First Embodiment]

Hereinafter, a first embodiment of the present invention will be described with reference to the accompanying drawings.

Figure 1:
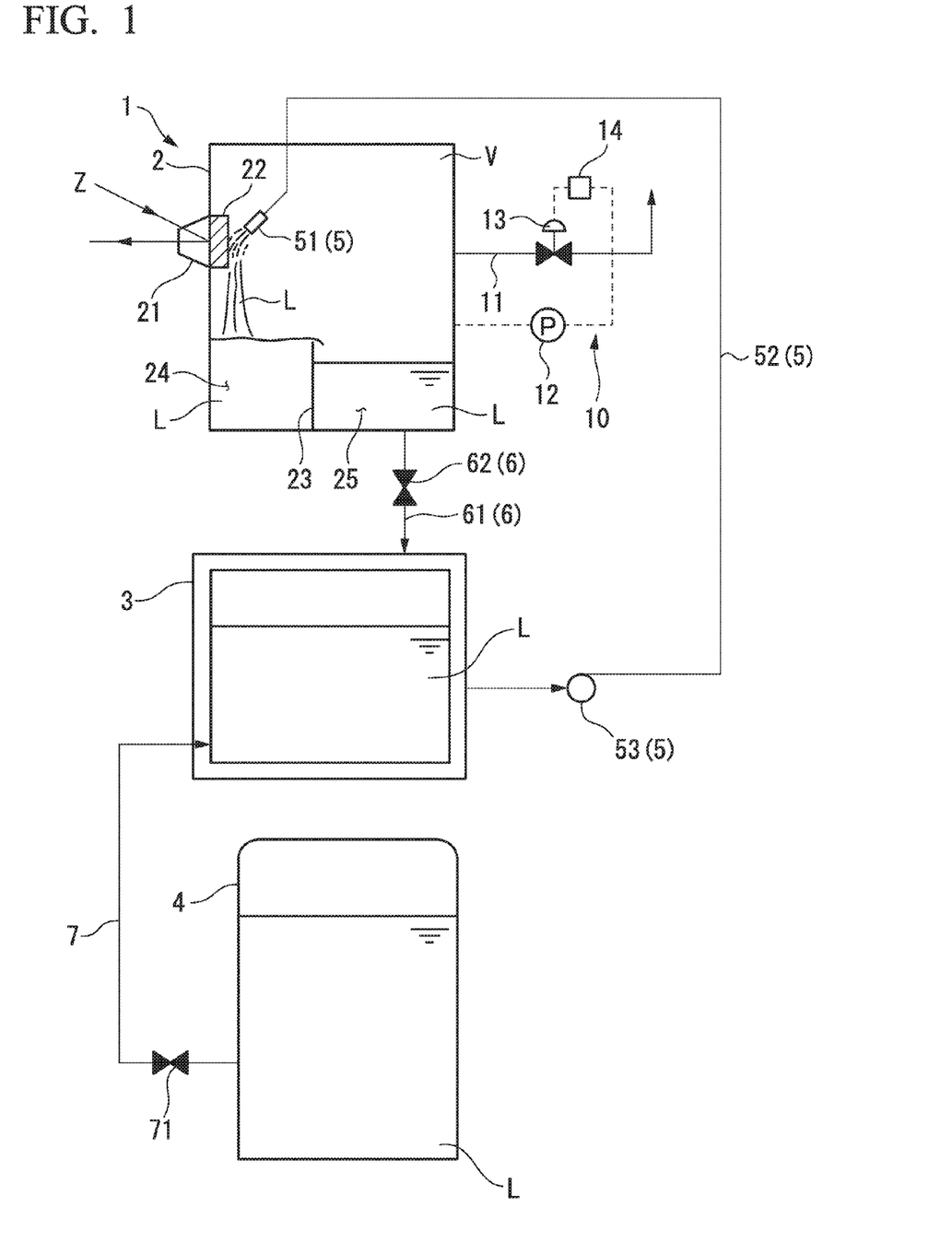
FIG. 1 is a diagram illustrating a laser-oscillation cooling device according to a first embodiment of the present invention.
Figure 2:
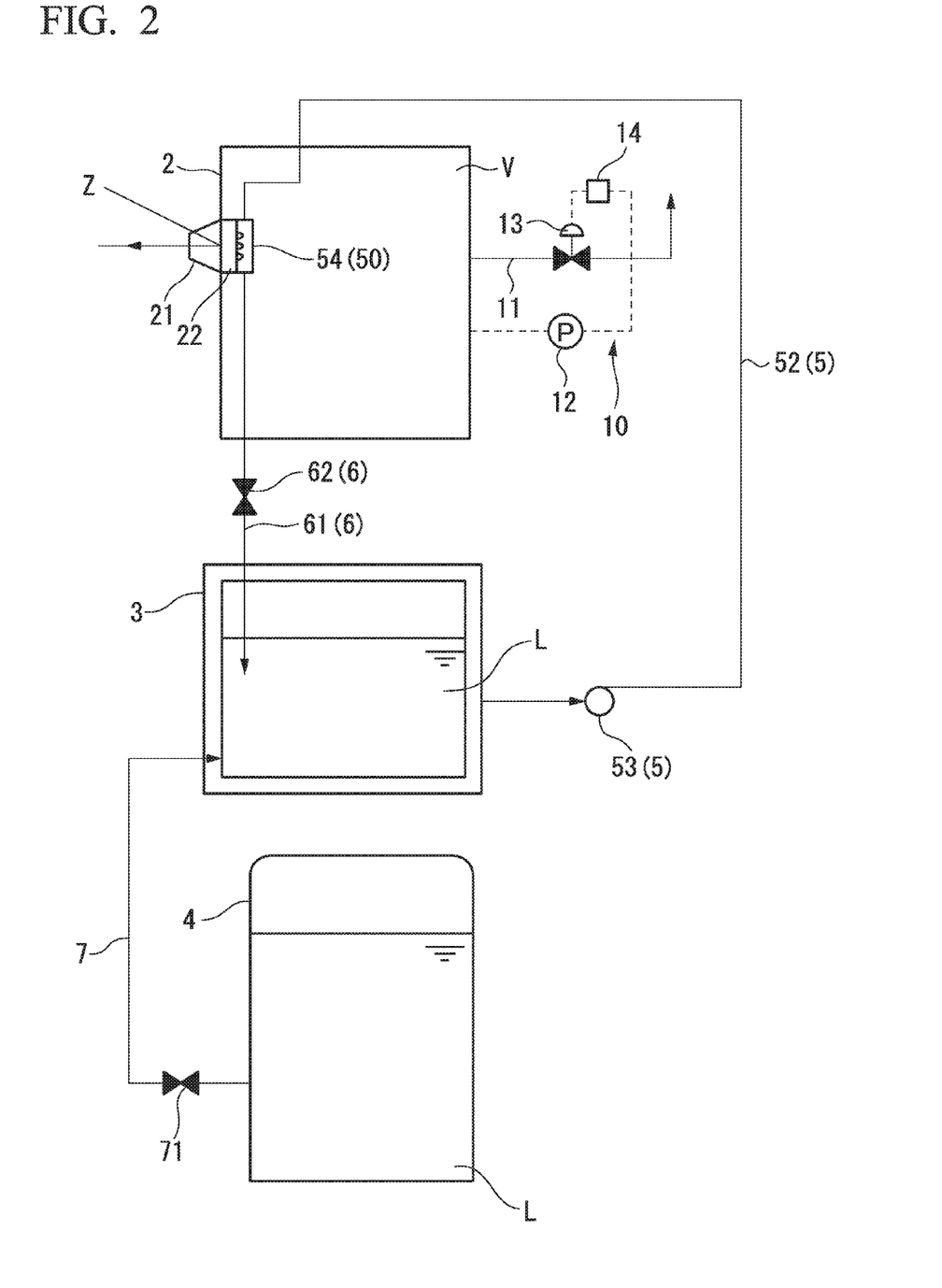
FIG. 2 is a diagram illustrating a laser-oscillation cooling device according to a second embodiment of the present invention.

As illustrated in FIG. 1, a laser-oscillation cooling device 1 includes a cryostat 2 of which the inside is kept at a low temperature, a laser excitation unit 21 that is disposed on an outer wall of the cryostat 2 and excites a laser beam, a storage tank 3 that stores a cryogenic liquid L therein, a decompression and return unit 6 that decompresses the cryogenic liquid L which is provided to cool the laser excitation unit 21 in the cryostat 2 and returns the cryogenic liquid L to the storage tank 3, and a pressurization and supply unit 50 that connects the storage tank 3 and the cryostat 2 and supplies the cryogenic liquid L stored in the storage tank 3 to the laser excitation unit. The laser-oscillation cooling device 1 further includes a cylinder 4 that supplies the cryogenic liquid L to the storage tank 3.

The cryostat 2 is a known device that is generally used for an experiment or the like in which a sample needs to be kept in a low-temperature state. The cryostat 2 is a box-like container that has a tightly closed space V therein. The space V in the cryostat 2 is thermally isolated from the outside. With the supply of a cooling medium at an extremely low temperature, the inside of the space V is kept at a low temperature. The inside of the cryostat 2 according to this embodiment is pressurized by a pressurization device which is not illustrated, and is substantially kept at 0.3 MPa.

The cryostat 2 is provided with a pressure control unit 10 that lowers a pressure separately from the above-mentioned pressurization device. The pressure control unit 10 includes a pipe line 11 that causes the inside of the cryostat 2 to communicate with the outside, a pressure gauge 12 that is connected to a pressure control valve 13 and measures the pressure in the cryostat 2, the pressure control valve 13 that can control a degree of opening thereof, and a controller 14 that adjusts the degree of opening of the pressure control valve 13.

The controller 14 adjusts the degree of opening of the pressure control valve 13 on the basis of a pressure value in the cryostat 2 which is measured by the pressure gauge 12. When it is detected that the pressure in the cryostat 2 is greater than 0.3 MPa on the basis of the measured value of the pressure gauge 12, the controller 14 adjusts the degree of opening of the pressure control valve 12 to increase the degree of opening. When the degree of opening of the pressure control valve 13 increases, gas (gas including an evaporated component of the cryogenic liquid L and air as major components) filled in the cryostat 2 is discharged to the outside via the pipe line 11. Accordingly, the pressure in the cryostat 2 is lowered to an appropriate value (substantially 0.3 MPa).

On the other hand, when the pressure in the cryostat 2 is lower than 0.3 MPa, the controller 14 adjusts the degree of opening of the pressure control valve 13 to decrease the degree of opening. At this time, since the evaporated component of the cryogenic liquid L and the like gradually remain in the cryostat 2, the pressure gradually increases. Thereafter, at a time point at which the pressure reaches a desired value, the pressure control valve 13 is closed.

When a rapid increase in pressure is requested, the inside of the cryostat may be pressurized using the above-mentioned pressurization device.

The cryostat 2 is provided with a partition wall 23 that extends upward from the bottom face thereof. The partition wall 23 extends to a middle height in a height direction of the cryostat 2. That is, a first liquid storage bath 24 and a second liquid storage bath 25 are defined in a lower region in the cryostat 2 by the partition wall 23 and the inner wall of the cryostat 2.

A spray nozzle 51 of the pressurization and supply unit 50, which will be described later, and a pipe line 52 connected to the spray nozzle 51 are introduced into the cryostat 2. The spray nozzle 51 is disposed to spray the cryogenic liquid L supplied via the pipe line 52 toward a cooling and support unit 22 of the laser excitation unit 21.

Here, as the cryogenic liquid L, liquid nitrogen is exemplified in this embodiment. However, the kind of the cryogenic liquid L is not limited to the liquid nitrogen, but any one can be selected and used from a group of liquid-phase inert elements such as liquid helium and liquid neon.

The laser excitation unit 21 is disposed in part of the outer wall of the cryostat 2 with the cooling and support unit 22. The laser excitation unit 21 is a device that amplifies an incident laser beam Z and outputs the amplifier laser beam to the outside. The laser excitation unit 21 is constituted, for example, using sapphire or yttrium aluminum garnet (YAG) crystals as a laser excitation medium.

The laser excitation unit 21 is disposed to protrude to the outside of the cryostat 2. Conversely, the cooling and support unit 22 supporting the laser excitation unit 21 is disposed to face the inside of the cryostat 2. The laser excitation unit 21 and the cooling and support unit 22 are thermally connected to each other. Accordingly, the laser excitation unit 21 and the cooling and support unit 22 are configured so that a majority of heat transferred to the cooling and support unit 22 is immediately transferred to the laser excitation unit 21.

The laser excitation unit 21 is disposed above the first liquid storage bath 24 among the first liquid storage bath 24 and the second liquid storage bath 25 which are disposed in the cryostat 2.

The decompression and return unit 6 connects the cryostat 2 to the storage tank 3. The decompression and return unit 6 includes a pipe line 61 connecting the second liquid storage bath 25 in the cryostat 2 to the storage tank 3 and a decompression valve 62 disposed in the middle of the pipe line 61.

The cryogenic liquid L supplied from the second liquid storage bath 25 flows in the pipe line 61. The cryogenic liquid L flows to the storage tank 3 via the pipe line 61. In order to cause the cryogenic liquid L to flow in the pipe line 61, for example, a constitution using a pump which is not illustrated or a constitution causing the cryogenic liquid to fall due to gravity is considered. When the cryogenic liquid is made to fall due to gravity, it is preferable that the cryostat 2 be disposed above the storage tank 3 to apply a satisfactory gravitational force to the cryogenic liquid L.

The decompression valve 62 is a known liquid decompression valve that is disposed to lower the pressure of the cryogenic liquid L flowing in the pipe line 61. The cryogenic liquid L passing through the decompression valve 62 is decompressed and thus decreases in temperature. In this embodiment, the cryogenic liquid L can be lowered to an atmospheric pressure (substantially 0.1 MPa) by the decompression valve 62.

The storage tank 3 is a tank that is connected to the cryostat 2 via the pipe line 61 of the decompression and return unit 6. The cryogenic liquid L flowing through the decompression and return unit 6 is stored in the storage tank 3. The pressure in the storage tank is kept substantially equal to the atmospheric pressure.

The pressurization and supply unit 5 includes the spray nozzle 51 that is introduced into the cryostat 2, the pipe line 52 that connects the spray nozzle 51 to the storage tank 3 and allows the cryogenic liquid L to flow therein, and a pressurization pump 53 that is disposed in the pipe line 52. The pressurization and supply unit 5 is a device that connects the storage tank 3 and the cryostat 2 and supplies the cryogenic liquid L stored in the storage tank 3 to the laser excitation unit 21 (the cooling and support unit 22).

The spray nozzle 51 is a nozzle member that sprays the cryogenic liquid L supplied via the pipe line 52 from the storage tank 3 toward the inside of the cryostat 2. A spray hole in the spray nozzle 51 has a diameter sufficiently smaller than that of the pipe line 52. Accordingly, a flow speed of the cryogenic liquid L sprayed from the spray nozzle 51 is higher than a flow speed when the cryogenic liquid passes through the pipe line 52.

The spray nozzle 51 is disposed at a position at which the cryogenic liquid L can be sprayed toward the cooling and support unit 22 integrally disposed with the laser excitation unit 21.

The pressurization pump 53 is a known liquid pump that feeds a liquid along the pipe line 52 by pressurizing the liquid passing therein. That is, the cryogenic liquid L is fed in a direction from the storage tank 3 to the spray nozzle 51 along the pipe line 52 by the pressurization pump 53.

The cylinder 4 is a container that contains the cryogenic liquid L therein. The cryogenic liquid L in a liquid phase is stored in the cylinder. The cylinder 4 is connected to the storage tank 3 via a pipe line 7. A flow rate adjusting valve 71 is disposed in the pipe line 7. It is possible to adjust the flow rate of the cryogenic liquid L supplied from the cylinder 4 to the storage tank 3 by opening and closing the flow rate adjusting valve 71. That is, when the amount of cryogenic liquid L in the storage tank 3 decreases, the storage tank can be supplemented with the cryogenic liquid L from the cylinder 4 by opening the flow rate adjusting valve 71. Although not illustrated in the drawing, a liquid level sensor that senses a liquid level of the cryogenic liquid L in the storage tank 3 and a control unit that controls the opening and closing of the flow rate adjusting valve 71 depending on the output of the liquid level sensor may be separately provided.

According to this constitution, it is possible to autonomously supply the cryogenic liquid L to the storage tank 3.

Subsequently, an operation of the laser-oscillation cooling device 1 according to this embodiment will be described.

First, the laser excitation unit 21 is irradiated with the laser beam Z from a light source which is not illustrated. The laser beam Z is excited by the excitation medium in the laser excitation unit 21 and is irradiated toward the outside from the laser excitation unit 21. At this time, the laser excitation unit 21 locally emits heat by irradiation with the laser beam Z. Specifically, the amount of heat emitted reaches 0.25 KW per square centimeter. Accordingly, the laser excitation unit 21 needs to be cooled via the cooling and support unit 22.

In order to cool the laser excitation unit 21, the flow rate adjusting valve 71 is first opened to supply the cryogenic liquid L from the cylinder 4 to the storage tank 3. When it is confirmed that a desired amount of cryogenic liquid L is stored in the storage tank 3, the pressurization pump 53 is driven.

When the pressurization pump 53 is driven, the cryogenic liquid L stored in the storage tank 3 is supplied to the spray nozzle 51 via the pipe line 52. The cryogenic liquid L reached the spray nozzle 51 is sprayed from the spray nozzle 51 toward the cooling and support unit 22 in the cryostat 2. Accordingly, the cooling and support unit 22 in a high-temperature state is cooled. Here, part of the cryogenic liquid L cooled the cooling and support unit 22 is evaporated due to the high temperature of the cooling and support unit 22 and stays in the cryostat 2. The component of the cryogenic liquid L which is evaporated due to the cooling is substantially about 1 percent by volume.

Since liquid nitrogen is used as the cryogenic liquid L in this embodiment, the temperature of the cryogenic liquid L in the storage tank 3 under the atmospheric pressure (about 0.1 MPa) is equal to or lower than −196° C. On the other hand, since the inside of the cryostat 2 is pressurized to about 0.3 MPa as described above, the temperature of the cryogenic liquid L sprayed from the spray nozzle 51 increases to about −180° C. (see FIG. 3). In this way, by spraying the cryogenic liquid L of a temperature about −180° C., the cooling and support unit 22 is satisfactorily cooled.

The cryogenic liquid L provided to cool the cooling and support unit 22 drops downward from the cooling and support unit 22. As described above, the first liquid storage bath 24 is disposed below the cooling and support unit 22. Accordingly, the dropping cryogenic liquid L is stored in the first liquid storage bath 24. Since the amount of cryogenic liquid L which is provided for the cooling and evaporated is substantially 1 percent by volume as described above, the cryogenic liquid L stored in the first liquid storage bath 24 is about 99 percent by volume of the amount of cryogenic liquid supplied from the spray nozzle 51.

By continuously spraying the cryogenic liquid L toward the cooling and support unit 22 in the above-mentioned state, the laser excitation unit 21 is continuously cooled. By continuously performing the cooling, the amount of cryogenic liquid L stored in the first liquid storage bath 24 gradually increases. As a result, the liquid level of the cryogenic liquid L stored in the first liquid storage bath 24 reaches a dimension to which the partition wall 23 extends.

Thereafter, when the cooling is additionally continuously performed, the liquid level of the cryogenic liquid L exceeds the partition wall 23. In other words, the cryogenic liquid L flows over the first liquid storage bath 24 and flows to the second liquid storage bath 25 adjacent thereto. Thereafter, the cryogenic liquid L is stored in the second liquid storage bath 25.

Subsequently, when the liquid level of the cryogenic liquid L stored in the second liquid storage bath 25 reaches a predetermined value, the decompression valve 62 is opened. That is, until a predetermined amount of cryogenic liquid L is stored in the second liquid storage bath 25, the decompression valve 62 is not opened. Here, when the amount of cryogenic liquid L stored is small and the decompression valve 62 is opened, a sufficient flow rate is not achieved and a possibility exists that gas in the cryostat 2 may be involved with the flow of the cryogenic liquid.

In the cryostat 2 according to this embodiment, the first liquid storage bath 24 and the second liquid storage bath 25 are formed by the partition wall 23. According to this constitution, a constant amount of cryogenic liquid L is stored in the first liquid storage bath 24 during operation of the laser-oscillation cooling device 1. Accordingly, since the temperature in the cryostat 2 is kept at a low temperature by the cryogenic liquid L stored in the first liquid storage bath 24, it is possible to more effectively cool the laser excitation unit 21. Even when the amount of cryogenic liquid L stored in the second liquid storage bath 25 varies by opening the decompression valve 62, it is possible to suppress a rapid variation of the temperature in the cryostat 2.

The cryogenic liquid L passing through the decompression valve 62 flows to the storage tank 3. That is, the cryogenic liquid L supplied from the storage tank 3 via the spray nozzle 51 is returned to the storage tank 3 by the decompression and return unit 6.

As described above, about 99 percent by volume of the cryogenic liquid L is stored in the first liquid storage bath 24 and the second liquid storage bath 25. Most of the cryogenic liquid L stored in the second liquid storage bath 25 can be recovered and returned to the storage tank 3 by the decompression and return unit 6. Accordingly, it is possible to recover and reuse about 99 percent of the entire cryogenic liquid L. That is, according to the laser-oscillation cooling device 1, it is possible to satisfactorily cool the laser excitation unit 21 in a high-temperature state and to recover and reuse the cryogenic liquid L as a cooling medium with high efficiency.

According to the above-mentioned constitution, the decompression and return unit 6 includes the decompression valve 62 that decompresses the cryogenic liquid L. According to this constitution, it is possible to sufficiently decompress the cryogenic liquid L by causing the cryogenic liquid L to pass through the decompression valve 62 and to simply constitute the decompression and return unit 6.

In the above-mentioned constitution, the laser excitation unit 21 is disposed in the cryostat 2. According to this constitution, since the surrounding of the laser excitation unit 21 and the cooling and support unit 22 can be kept at a low temperature, it is possible to more effectively cool the laser excitation unit 21 as a heat-emitting body.

In the above-mentioned constitution, the pressurization and supply unit 50 is provided with the spray nozzle 51 that sprays the cryogenic liquid L onto the laser excitation unit 21. According to this constitution, since the cryogenic liquid L can be supplied to the laser excitation unit 21 at a higher flow speed by spraying the cryogenic liquid L from the spray nozzle 51, it is possible to more effectively cool the laser excitation unit 21.

While an embodiment of the present invention has been described above with reference to the drawings, the specific constitution thereof is not limited to the embodiment but includes modifications in design without departing from the gist of the present invention.

[Second Embodiment]

Hereinafter, a second embodiment of the present invention will be described with reference to the accompanying drawings.

The same elements as in the above-mentioned first embodiment will be referenced by the same reference signs and detailed description thereof will not be repeated.

Figure 3:
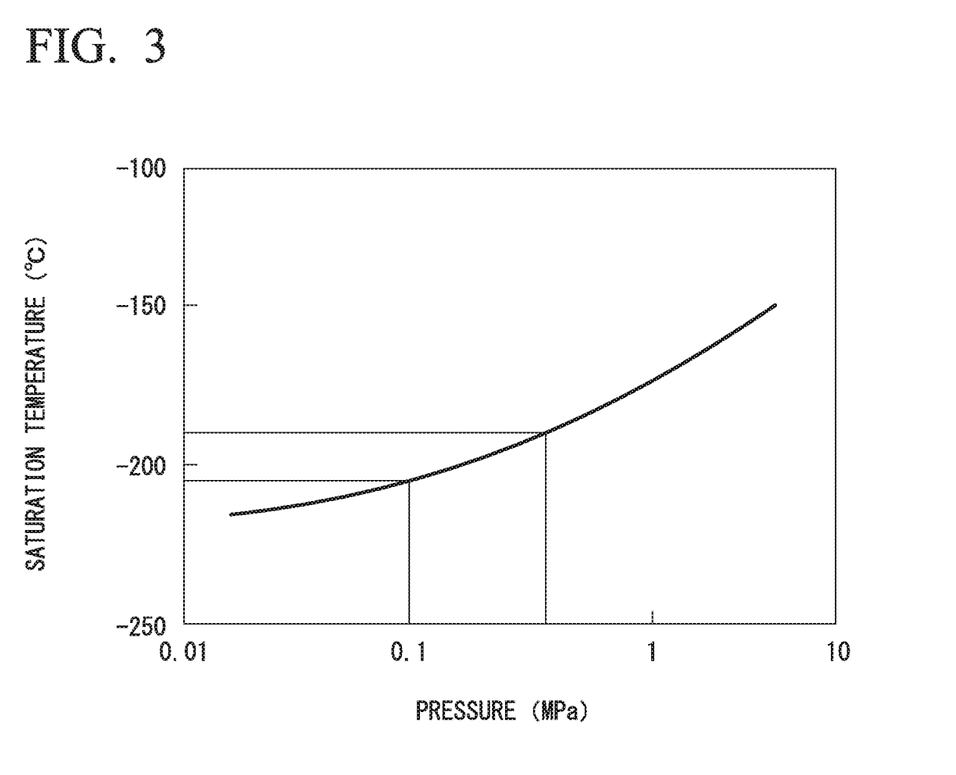
FIG. 3 is a diagram illustrating a relationship of pressure and temperature of a cryogenic liquid in a decompression and return unit according to the embodiments of the present invention.

As illustrated in FIG. 3, a laser-oscillation cooling device 1 according to this embodiment is different from the laser-oscillation cooling device according to the first embodiment in the following points. That is, in this embodiment, a micro-channel 54 is disposed in the cryostat 2. More specifically, the micro-channel 54 is disposed to come in contact with the cooling and support unit 22. More preferably, the micro-channel 54 has a size which covers the entire surface of the cooling and support unit 22.

Figure 4:
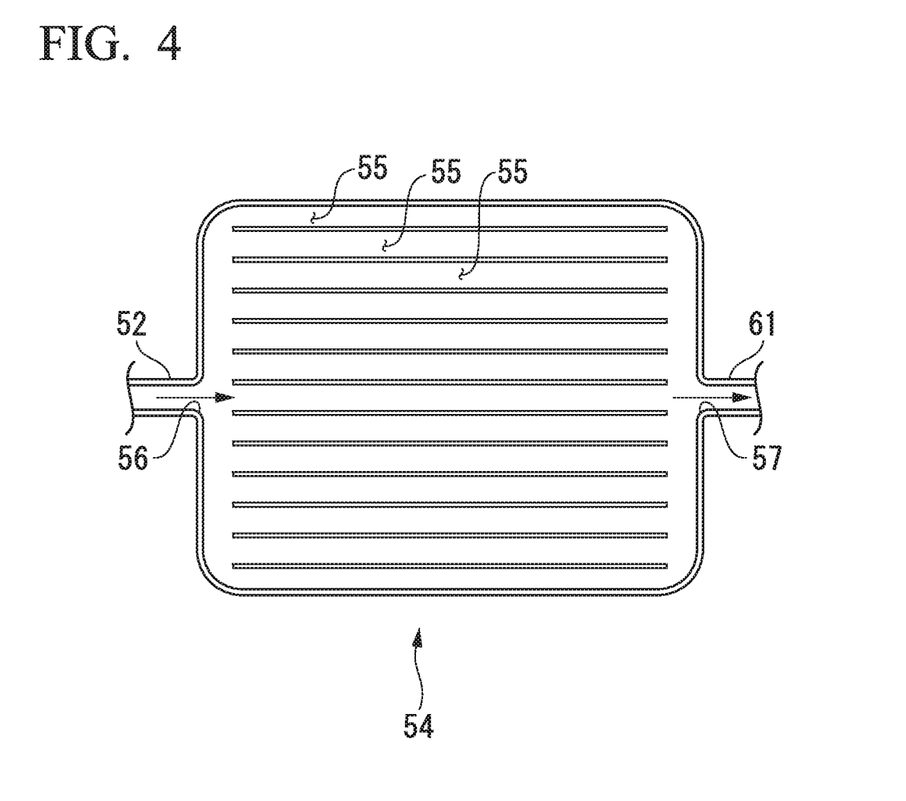
FIG. 4 is a schematic diagram illustrating a micro-channel according to the second embodiment of the present invention.

The micro-channel 54 is a known cooling device in which a plurality of pipe-like channels 55 are arranged. Ends on one side of the plurality of pipe-like channels 55 are merged into one channel which serves as an inflow port 56. Ends on the other side of the plurality of pipe-like channels 55 are merged into one channel which serves as an outflow port 57. The inflow port 56 is connected to the above-mentioned pipe line 52. That is, the cryogenic liquid L flows into the micro-channel 54 via the inflow port 56, passes through the plurality of pipe-like channels 55, and is discharged to the pipe line 61 via the outflow port 57.

As described above, the micro-channel 54 has such a size which covers the entire surface of the cooling and support unit 22. Accordingly, the cryogenic liquid L widely diffuses to the entire surface of the cooling and support unit 22 via the plurality of pipe-like channels 55. As a result, it is possible to more effectively cool the cooling and support unit 22.

INDUSTRIAL APPLICABILITY

According to the above-mentioned laser-oscillation cooling device, it is possible to achieve a satisfactory cooling effect of an object and to appropriately recover a cooling medium.

REFERENCE SIGNS LIST

1 Laser-oscillation cooling device
2 Cryostat
3 Storage tank
4 Cylinder
5 Pressurization and supply unit
6 Decompression and return unit
7 Pipe line 10 Pressure control unit
11 Pipe line
12 Pressure gauge
13 Pressure control valve
14 Controller
21 Laser excitation unit
22 Cooling and support unit
23 Partition wall
24 First liquid storage bath
25 Second liquid storage bath
51 Spray nozzle
52 Pipe line
53 Pressurization pump
61 Pipe line
62 Decompression valve
71 Flow rate adjusting valve
L Cryogenic liquid
V Space
Z Laser beam

The invention claimed is:

1. A laser-oscillation cooling device comprising:
a laser excitation unit that excites a laser beam and locally emits heat;
a storage tank capable of storing a cryogenic liquid at an atmospheric pressure;
a pressurization and supply unit that pressurizes the cryogenic liquid stored in the storage tank and supplies the pressurized cryogenic liquid to the laser excitation unit;
a decompression and return unit that decompresses the cryogenic liquid which is supplied to the laser excitation unit and used to cool the laser excitation unit and returns the cryogenic liquid to the storage tank; and
a cryostat in which the laser excitation unit is disposed and the inside of the cryostat is kept at a low temperature,
wherein the cryostat is provided with a partition wall that extends upward from the bottom face of the cryostat, and a first liquid storage bath and a second liquid storage bath are defined in a lower region in the cryostat by the partition wall and an inner wall of the cryostat,
wherein the laser excitation unit is disposed above the first liquid storage bath, and
wherein the decompression and return unit is connected to the second liquid storage bath so as to be configured to decompress the cryogenic liquid from the second liquid storage bath.

2. The laser-oscillation cooling device according to claim 1, wherein the decompression and return unit includes a decompression valve that decompresses the cryogenic liquid.

3. The laser-oscillation cooling device according to claim 1, wherein the pressurization and supply unit includes a spray nozzle that sprays the cryogenic liquid toward the laser excitation unit.

4. The laser-oscillation cooling device according to claim 1, wherein the pressurization and supply unit includes a micro-channel that is disposed to come in contact with the laser excitation unit and in which the pressurized cryogenic liquid flows.

* * * * *